united States Patent [19]

Zhang et al.

US005770486A

[11] Patent Number: 5,770,486
[45] Date of Patent: Jun. 23, 1998

[54] METHOD OF FORMING A TRANSISTOR WITH AN LDD STRUCTURE

[76] Inventors: Hongyong Zhang, Paresu Miyagami 302, 1-10-15, Fukamidai, Yamato-shi, Kanagawa-ken 242; Yasuhiko Takemura, Flat Atsugi 208, 931-1, Hase, Atsugi-shi, Kanagawa-Ken 243, both of Japan

[21] Appl. No.: 616,765

[22] Filed: Mar. 15, 1996

Related U.S. Application Data

[63] Continuation of Ser. No. 216,108, Mar. 21, 1994, abandoned.

[30] Foreign Application Priority Data

Mar. 22, 1993 [JP] Japan ..................................... 5-086749

[51] Int. Cl.⁶ .......................... H01L 21/268; H01L 21/84
[52] U.S. Cl. .......................... 438/163; 438/305; 438/307; 438/308; 438/530
[58] Field of Search ................................. 437/40, 41, 44, 437/21, 101, 909, 173, 174, 19; 257/59, 900, 66, 408; 148/DIG. 1; 438/163, 166, 303, 305, 307, 308, 530

[56] References Cited

U.S. PATENT DOCUMENTS

| 4,394,191 | 7/1983 | Wada et al. . | |
|---|---|---|---|
| 4,722,909 | 2/1988 | Parillo et al. . | |
| 5,112,764 | 5/1992 | Mitra et al. | 437/41 |
| 5,231,039 | 7/1993 | Savono et al. | 437/41 |
| 5,262,654 | 11/1993 | Yamazaki . | |
| 5,278,093 | 1/1994 | Yonehara | 148/DIG. 1 |
| 5,287,205 | 2/1994 | Yamazaki et al. . | |
| 5,289,030 | 2/1994 | Yamazaki et al. . | |
| 5,292,675 | 3/1994 | Codama | 437/41 |
| 5,306,651 | 4/1994 | Masumo et al. | 437/40 |
| 5,308,998 | 5/1994 | Yamazaki et al. . | |
| 5,317,432 | 5/1994 | Ino . | |
| 5,326,712 | 7/1994 | Bae | 148/DIG. 1 |
| 5,328,862 | 7/1994 | Goo | 437/40 |
| 5,348,897 | 9/1994 | Yen | 437/40 |
| 5,476,802 | 12/1995 | Yamazaki et al. | 437/21 |
| 5,482,870 | 1/1996 | Inoue | 437/21 |
| 5,561,075 | 10/1996 | Nakazawa | 437/41 TFT |
| 5,563,440 | 10/1996 | Yamazaki et al. | 437/40 TFT |

FOREIGN PATENT DOCUMENTS

| 55-24420 | 2/1980 | Japan . | |
|---|---|---|---|
| 2-94519 | 4/1990 | Japan . | |
| 2-307273 | 12/1990 | Japan | 437/40 TFT |
| 5-114724 | 7/1993 | Japan . | |
| 6-112223 | 4/1994 | Japan | 437/21 |
| 6-232160 | 8/1994 | Japan | 437/21 |

OTHER PUBLICATIONS

J.R. Pfeister, IEEE Electron Dev. Lett. 9(4)(1988)189 "LDD Mosfet's using disposable spacer technology" Apr. 1988.

Primary Examiner—Charles L. Bowers, Jr.
Assistant Examiner—Leon Radomsky

[57] ABSTRACT

A crystalline silicon thin film transistor having an LDD (lightly doped drain) structure and a process for fabricating the same, which comprises establishing an LDD by forming a gate insulating film and a gate electrode on an island-like semiconductor region and implanting thereafter impurities in a self-aligned manner to establish an LDD, anodically oxidizing the gate electrode and introducing impurities to form source and drain regions, partially or wholly removing the anodic oxide from the surface of the island-like semiconductor region to expose the LDD region, and irradiating a laser beam or an intense light having an intensity equivalent to that of the laser beam to activate the impurity region inclusive of the LDD.

20 Claims, 2 Drawing Sheets

METHOD OF FORMING A TRANSISTOR WITH AN LDD STRUCTURE

This application is a continuation of Ser. No. 08/216,108, filed Mar. 21, 1994, now abandoned.

BACKGROUND OF THE INVENTION

1. Field of the Invention

The present invention relates to a thin film transistor (TFT) comprising a thin film of a non-single crystal semiconductor, and to a process for fabricating the same. The thin film transistor according to the present invention can be formed on either an insulator substrate such as a glass substrate or a semiconductor substrate such as a single crystal silicon. In particular, the present invention relates to a thin film transistor fabricated through the steps of crystallization and activation of doped impurities by irradiating a laser beam or an intense light having an intensity equivalent to that of the laser beam. This process is hereinafter referred to as "laser annealing".

2. Prior Art

Recently, active study is made on semiconductor devices of insulated-gate type comprising an insulator substrate having thereon a thin film active layer (which is sometimes referred to as "active region"). In particular, much effort is paid on the study of insulated-gate transistors of thin film type, i.e., the so-called thin film transistors (TFTs). The TFTs can be classified into, for example, amorphous silicon TFTs and crystalline silicon TFTs, according to the material and the state of the semiconductor employed in the TFT. The term "crystalline silicon" refers to non-single crystal silicon, which encompasses all types of crystalline silicon except single crystal silicon.

In general, semiconductors in an amorphous state have a low electric field mobility. Accordingly, they cannot be employed in TFTs used for high speed operation. Furthermore, the electric field mobility of a P-type amorphous silicon is extremely low. This makes the fabrication of a P-channel, TFT (a PMOS TFT) unfeasible. It is therefore difficult to obtain a complementary MOS (CMOS) circuit from such a P-channel TFT, because the implementation of a CMOS circuit requires combining a P-channel TFT with an N-channel TFT (NMOS TFT).

In contrast to the amorphous semiconductors, crystalline semiconductors have higher electric field mobilities, and are therefore suitable for use in TFTs operating in high speed. Crystalline silicon is further advantageous in that a CMOS circuit can be easily fabricated therefrom, because not only an NMOS TFT but also a PMOS TFT is available from crystalline silicon. Furthermore, it is pointed out that further improved characteristics can be obtained by establishing an LDD (lightly doped drain) structure known in the conventional single crystal semiconductor MOS ICs.

An LDD structure can be obtained by the following process steps:

forming island-like semiconductor regions and a gate insulating film;

forming a gate electrode;

introducing impurities at a low concentration to form lightly doped regions by ion implantation or ion doping;

forming masks for the LDD region (by anisotropic etching of the insulating film covering the gate electrode, or by selective oxidation of the anodic oxide covering the gate electrode);

introducing impurities at high concentration by ion implantation or ion doping; and activating the impurities by laser annealing or thermal annealing.

The most problematic in the above process is the sixth step, in which the amorphous silicon is activated by laser annealing or by thermal annealing. Laser annealing comprises irradiating a laser beam or an intense light having an intensity equivalent to that of a laser beam. However, in general, the laser beam is irradiated from the upper side of the gate electrode. It then results in an insufficiently activated LDD region, because the mask formed in the fourth step functions as a shield.

In contrast to the case using laser annealing, the LDD region can be sufficiently activated by thermal annealing. However, in general, the impurities in the silicon film must be activated by annealing for a long period of time at about 600° C., or by annealing at a high temperature of 1,000° C. or higher. The latter method, i.e., the high temperature annealing can be applied only to cases using quartz substrates, and the use of such expensive substrates considerably increases the production cost. The former process can be applied to a wide variety of substrates. However, the use of inexpensive substrates brings about other problems such as the shrinking of substrates during thermal annealing, because it leads to a low product yield due to the failure upon mask matching. It is therefore necessary to effect the treatments at lower temperatures when such inexpensive substrates are used.

The present invention provides a solution to the aforementioned problems difficult to solve.

SUMMARY OF THE INVENTION

The problems above are overcome by the present invention, which comprises, before laser annealing, exposing the LDD region by partly or wholly removing the anodic oxide formed on the periphery of the gate electrode, and then subjecting the resulting structure to laser annealing.

DETAILED DESCRIPTION OF THE PREFERRED EMBODIMENTS

Figure 1A:
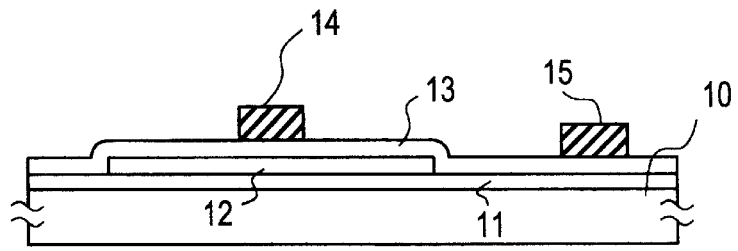
FIGS. 1(A) to 1(E) show schematically drawn step sequential cross section structures obtained in a process according to an embodiment of the present invention (Example 1)

In the process according to the present invention, the anodic oxide need not be removed over the entire portion of the interconnection being formed in the same layer in which the gate electrode is formed. The anodic oxide on at least the part present on the LDD region must be removed. More specifically, only the anodic oxide present on the periphery of the gate electrode formed on the island-like semiconductor region should be removed.

When the anodic oxide is formed not only on the side, but also on the upper surface of the gate electrode and the interconnection formed in the same layer of said gate electrode, the anodic oxide functions importantly as an insulator between the gate electrode and interconnection covered with the anodic oxide, and an interconnection layer formed on the anodic oxide. However, in general, the interconnections are provided as such that they may not cross on the island-like semiconductor region. Accordingly, the anodic oxide on the island-like semiconductor region can be safely removed without impairing the practical electric insulation properties so long as anodic oxide is left on other portions.

The present invention is illustrated in greater detail referring to non-limiting examples below. It should be understood, however, that the present invention is not to be construed as being limited thereto.

EXAMPLE 1

FIG. 1 shows the cross section view of the step sequential structures obtained by a process according to an embodiment of the present invention. Referring to FIG. 1, a 2,000 Å thick silicon oxide film 11 was formed by sputtering as a base film on a Corning #7059 glass substrate 10. Then, an intrinsic (I-type) amorphous silicon film 12 was deposited thereon by plasma CVD to a thickness of from 500 to 1,500 Å, for example, to a thickness of 1,500 Å, and a 200 Å thick silicon oxide film was further deposited thereon by sputtering. The amorphous silicon film was then crystallized by annealing at 600° C. in nitrogen atmosphere for a duration of 48 hours. After annealing, the silicon film was patterned to form an island-like silicon region 12, and a 1,000 Å thick silicon oxide film 13 was deposited thereon by sputtering as a gate insulating film. The sputtering process was performed in an atmosphere containing oxygen and argon at an argon to oxygen ratio of not higher than 0.5, for example, at a ratio of 0.1 or lower, using silicon oxide as the target. The temperature of the substrate during the process was maintained in the range of from 200° to 400° C., for example, at 250° C.

Then, an aluminum film containing from 0.1 to 2% of silicon was deposited by sputtering to a thickness of from 3,000 to 8,000 Å, for example, at a thickness of 6,000 Å. Preferably, the steps of depositing the silicon oxide film and the aluminum film are performed continuously. The resulting aluminum film was patterned to form a gate electrode 14 and an interconnection 15 as shown in FIG. 1(A). Needless to say, the gate electrode 14 and the interconnection 15 are present in the same layer.

Figure 1B:
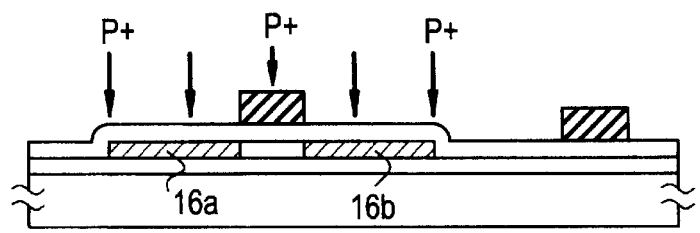

Phosphorus was then introduced as an impurity by plasma doping into the silicon region using the gate electrode as a mask. The doping was performed using phosphine ($PH_3$) as the doping gas, and applying an accelerating voltage in the range of from 60 to 90 kV, for example, at 80 kV, to introduce phosphorus at a dose in the range of from $1 \times 10^{13}$ to $8 \times 10^{13}$ $cm^{-2}$. Phosphorus in this case was incorporated at a dose of $2 \times 10^{13}$ $cm^{-2}$. In this manner, N-type impurity regions 16a and 16b were formed as shown in FIG. 1(B).

The resulting substrate was immersed into an ethylene glycol solution containing tartaric acid at a concentration of from 1 to 5%, and electric current was applied to the gate electrode 14 and the interconnection 15 to allow an anodic oxide (aluminum oxide) layer 17 to grow on the surface thereof. An anodic oxide layer of uniform thickness can be formed stably by electrically connecting the gate electrode 14 and the interconnection 15. The anodic oxide is preferably grown to a thickness of from 1,000 to 5,000 Å, and particularly preferably, in the thickness range of from 2,000 to 3,000 Å. In this case, the anodic oxide layer was formed at a thickness of 2,500 Å.

Figure 1C:
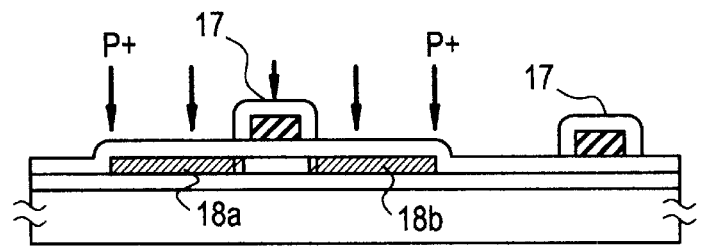

Then, phosphorus as an impurity was introduced again into the silicon region by plasma doping, using the gate electrode and the peripheral anodic oxide as the mask. The doping was performed using phosphine ($PH_3$) as the doping gas, and applying an accelerating voltage in the range of from 60 to 90 kV, for example, at 80 kV, to introduce phosphorus at a dose in the range of from $1 \times 10^{15}$ to $8 \times 10^{15}$ $cm^{-2}$, specifically for example, at a dose of $2 \times 10^{15}$ $cm^{-2}$. In this manner, N-type impurity regions 18a and 18b containing the impurity at high concentration were formed. Furthermore, the previously formed LDD region (lightly doped drain region) was partly left over because the anodic oxide functioned as a mask. Thus was obtained a structure as shown in FIG. 1(C).

Figure 1D:
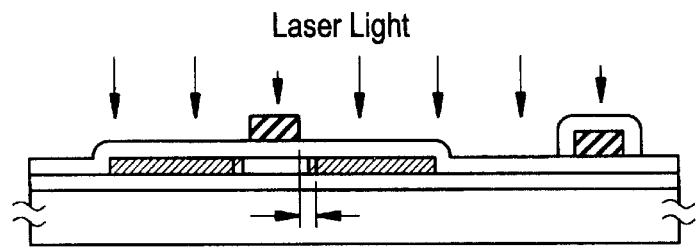

The anodic oxide formed on the gate electrode 14 was etched thereafter. The anodic oxide formed on the interconnection 15 was left as it was. As a result, a region (inclusive of the LDD region; indicated with an arrow in FIG. 1(D)) was newly exposed. Laser beam was irradiated to the resulting structure to effect laser annealing. The laser used in this case was a KrF excimer laser operating at a wavelength of 248 nm and a pulse width of 20 nsec. However, other lasers, such as a XeF excimer laser operating at a wavelength of 353 nm, a XeCl excimer laser operating at a wavelength of 308 nm, and an ArF excimer laser operating at a wavelength of 193 nm, may be used as well. The laser beam was applied at an energy density of from 200 to 500 $mJ/cm^2$, for example, at 250 $mJ/cm^2$, and from 2 to 10 shots, for instance, 2 shots, per site. The substrate was heated to a temperature in the range of from 100° to 450° C., for example at 400° C., during the laser irradiation. The impurity was activated in this manner. In this case, in particular, the LDD regions and the boundary between the active region and the LDD region were activated as well. The structure is shown in FIG. 1(D).

Figure 1E:
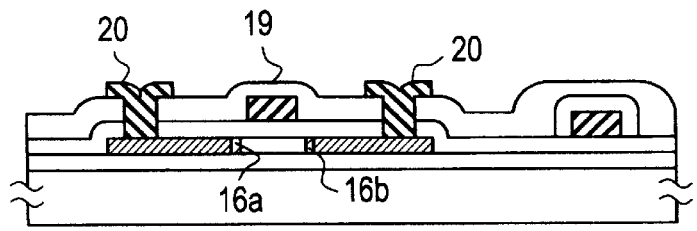

Subsequently, a 6,000 Å thick silicon oxide film 19 was formed as an interlayer insulator by plasma CVD, and contact holes were formed therein to establish electrodes with interconnections 20 for the source and the drain regions of the TFT, using a multilayered film comprising metallic materials, such as titanium nitride and aluminum. The resulting structure was annealed at 350° C. for 30 minutes in hydrogen atmosphere under a pressure of 1 atm. Thus was implemented a complete thin film transistor as shown in FIG. 1(E).

EXAMPLE 2

FIG. 2 shows the cross section view of the step sequential structures obtained by a process according to an embodiment of the present invention. Referring to FIG. 2, a 2,000 Å thick silicon oxide film 22 was formed by sputtering as a base film on a Corning #7059 glass substrate 21. Then, an intrinsic (I-type) amorphous silicon film was deposited thereon by plasma CVD to a thickness of from 200 to 1,500 Å, for example, to a thickness of 500 Å, and was patterned to form an island-like silicon region 23. The silicon region was crystallized by laser annealing. The laser used in this case was a KrF excimer laser. The laser beam was applied at an energy density of from 200 to 500 $mJ/cm^2$, for example, at 350 $mJ/cm^2$, and from 2 to 10 shots, for instance, 2 shots, per site. The substrate was heated to a temperature in the range of from 100° to 450° C., for example at 350° C., during the laser irradiation.

Then, a 1,000 Å thick silicon oxide film 24 was deposited as a gate insulating film by plasma CVD using tetraethoxysilane (TEOS; $Si(OC_2H_5)_4$) and oxygen as the starting materials. Trichloroethylene ($C_2HCl_3$) was also added into the starting gas material. Oxygen gas was flown into the chamber at a rate of 400 sccm (standard cubic centimeters per minute) before initiating the film deposition, and plasma was generated inside the chamber while maintaining the chamber at a total pressure 5 Pa and the substrate at a temperature of 300° C., and applying an RF power of 150 W. This state was kept for a duration of 10 minutes. Then, silicon oxide film was deposited by introducing oxygen, TEOS, and trichloroethylene into the chamber at a flow rate of 300 sccm, 15 sccm, and 2 sccm, respectively. The substrate temperature, RF power, and the total pressure during the film deposition were maintained at 300° C., 75 W, and 5 Pa, respectively. Upon completion of film deposition, hydrogen gas was introduced into the chamber at such an amount to control the pressure to 100 Torr, to effect hydrogen annealing at 350° C. for 35 minutes.

Figure 2A:
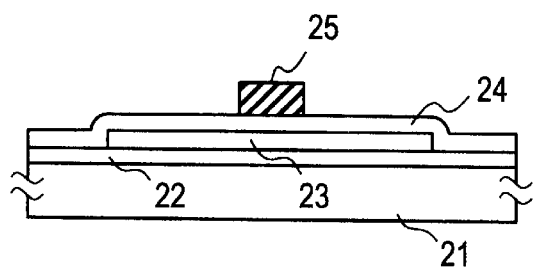
FIGS. 2(A) to 2(E) show schematically drawn step sequential cross section structures obtained in another process according to another embodiment of the present invention (Example 2).

Subsequently, a tantalum film was deposited by sputtering at a thickness of from 3,000 to 8,000 Å, for example, at a thickness of 6,000 Å. Aluminum, titanium, tungsten, molybdenum, or silicon can be used in the place of tantalum. Preferably, the deposition steps of the silicon oxide film 24 and the tantalum film are performed continuously. The tantalum film was patterned to form a gate electrode 25 for the TFT. Thus was obtained a structure as shown in FIG. 2(A).

Figure 2B:
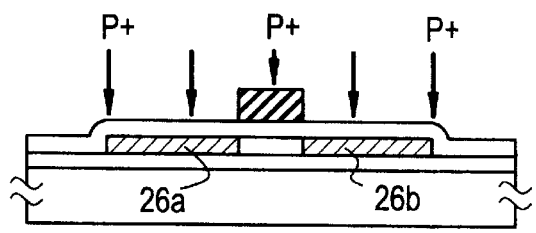

Phosphorus as an impurity was implanted into the silicon region thereafter by ion implantation using the gate electrode as the mask. The doping process was performed using phosphine ($PH_3$) as the doping gas and applying an accelerating voltage of 80 kV. Phosphorus in this case was incorporated at a dose of $2\times10^{13}$ cm$^{-2}$. In this manner, N-type impurity regions 26a and 26b were formed as shown in FIG. 2(B).

Figure 2C:
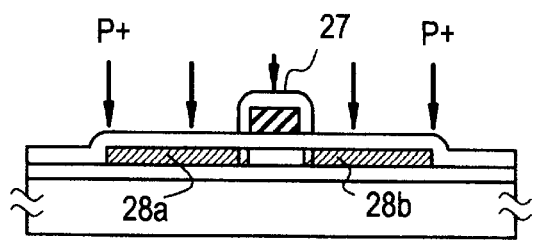

The surface of the tantalum interconnection was subjected to anodic oxidation to form an oxide (tantalum oxide) layer 27 on the surface thereof. The anodic oxidation was performed in an ethylene glycol solution containing from 1 to 5% of tartaric acid. Thus was obtained an oxide layer 2,000 Å in thickness. Phosphorus as an impurity was implanted into the silicon region thereafter again by ion implantation using the gate electrode as the mask. The doping process was performed by applying an accelerating voltage of 80 kV. Phosphorus in this case was incorporated at a dose of $2\times10^{15}$ cm$^{-2}$. In this manner, N-type impurity regions 28a and 28b containing the impurity at high concentration were formed as shown in FIG. 2(C).

Figure 2D:
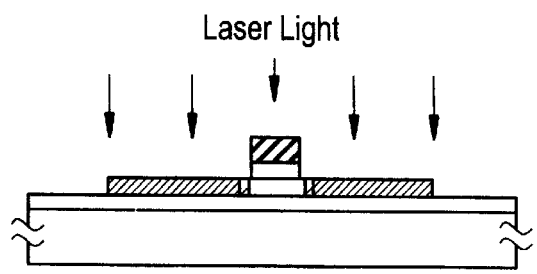

Subsequently, the anodic oxide 27 on the gate electrode and the silicon oxide film 24 (except for the silicon oxide film under the gate electrode) were removed, and the impurity was activated by laser annealing. The laser used in this case was a KrF excimer laser operated at a wavelength of 248 nm and a pulse width of 20 nsec. The laser beam was applied at an energy density of from 200 to 500 mJ/cm$^2$, for example, at 250 mJ/cm$^2$, and from 2 to 10 shots, for instance, 2 shots, per site. The substrate was heated during the laser irradiation to a temperature in the range of from 100° to 450° C., for example at 350° C. Thus was obtained a structure as shown in FIG. 2(D).

Figure 2E:
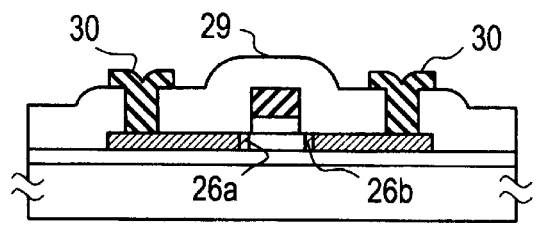

Then, a 2,000 Å thick silicon oxide film 29 was formed as an interlayer insulator by plasma CVD using TEOS as the material, and contact holes were formed therein to establish electrodes with interconnections 30a and 30b for the source and the drain regions of the TFT, using a multilayered film comprising metallic materials, such as titanium nitride and aluminum. Thus was implemented a complete thin film transistor as shown in FIG. 2(E).

The thin film transistor thus fabricated was found to yield an electric field mobility in the range of from 70 to 100 cm$^2$/Vs at a gate voltage of 10 V, a threshold voltage of from 2.5 to 4.0 V, and a leak current of $10^{-13}$ A or lower upon applying a voltage of –20 V.

The process according to the present invention provides a TFT having an LDD structure. In particular, the present invention advantageously provides an LDD region having a precision in width of about 10 Å. Specifically, the present invention enables precise processing by controlling the voltage of anodic oxidation. More important, the present invention provides an LDD greatly improved in reliability. This is a consequence of, as pointed out previously, performing the laser annealing after exposing the LDD region by removing the anodic oxide which functions as a shield upon laser irradiation. Conclusively, the present invention is greatly contributory to the industry.

While the invention has been described in detail and with reference to specific embodiments thereof, it will be apparent to one skilled in the art that various changes and modifications can be made therein without departing from the spirit and scope thereof.

What is claimed is:

1. A method of forming a transistor comprising:
   irradiating a laser light to a semiconductor region;
   forming a gate electrode on said semiconductor region;
   first introducing an impurity into said semiconductor region with said gate electrode as a mask;
   forming an oxide at least on a side surface of said gate electrode by anodic oxidation after said introducing step;
   second introducing an impurity into said semiconductor region with said gate electrode and said oxide as a mask;
   removing said oxide after said second introducing step; and
   activating said impurity in said semiconductor region after said removing step,
   wherein said irradiating step is carried out before said gate electrode forming step.

2. The method of claim 1 wherein said activating is carried out by irradiating a laser light or a light equivalent to a laser light to said semiconductor region, or by heating said semiconductor region, or by a combination of said irradiating and said heating.

3. The method of claim 1 wherein said semiconductor region is in the form of an island.

4. The method of claim 1 wherein a wiring is formed in the same layer as said gate electrode during said gate electrode forming step.

5. The method of claim 4 wherein an oxide is formed at least on a side surface of said wiring by said anodic oxidation.

6. The method of claim 5 wherein at least a portion of said oxide formed on the side surface of said wiring remains outside said semiconductor region after said removing step.

7. The method of claim 1 wherein said activating is carried out by irradiating a laser light to said semiconductor region, said laser light having a wavelength of 248 nm, 353 nm, 308 nm or 193 nm.

8. The method of claim 1 wherein said semiconductor region is provided on an insulating surface of a substrate.

9. The method of claim 1 wherein said activating is carried out by heating said semiconductor region to a temperature of 100° to 450° C.

10. A method of forming a transistor comprising:
    irradiating a laser light to a semiconductor island;
    forming a wiring comprising a portion as a gate electrode, said portion being formed on said semiconductor island;

first introducing an impurity into said semiconductor island with said portion as a mask;

forming an oxide at least on a side surface of said wiring by anodic oxidation after said introducing step;

second introducing an impurity into said semiconductor island with said portion and said oxide as a mask;

removing a portion of said oxide formed on said semiconductor island after said second introducing step; and activating the impurities in said semiconductor island after said removing step, wherein said irradiating step is carried out before said wiring forming step.

11. A method of forming a transistor comprising:

first irradiating a laser light to a semiconductor island;

forming a wiring comprising a portion as a gate electrode, said portion being formed on said semiconductor island;

first introducing an impurity into said semiconductor island with said portion as a mask;

forming an oxide at least on a side surface of said wiring after said introducing step;

second introducing an impurity into said semiconductor island with said portion and said oxide as a mask;

removing at least a portion of said oxide after said second introducing step; and activating the impurities in said semiconductor island after said removing step, wherein said irradiating step is carried out before said wiring forming step.

12. A method of forming a transistor comprising:

forming a gate electrode on a semiconductor region;

first introducing an impurity into said semiconductor region with said gate electrode as a mask;

forming an oxide at least on a side surface of said gate electrode by anodic oxidation after said introducing step;

second introducing an impurity into said semiconductor region with said gate electrode and said oxide as a mask;

removing said oxide after said second introducing step; and irradiating a laser light to said semiconductor region after said removing step, said laser light having a wavelength of 248 nm, 353 nm, 308 nm or 193 nm.

13. A method of forming a transistor comprising:

forming a wiring comprising a portion as a gate electrode, said portion being formed on a semiconductor island;

first introducing an impurity into said semiconductor island with said portion as a mask;

forming an oxide at least on a side surface of said wiring by anodic oxidation after said introducing step;

second introducing an impurity into said semiconductor island with said portion and said oxide as a mask;

removing a portion of said oxide formed on said semiconductor island after said second introducing step; and irradiating a laser light to said semiconductor island after said removing step, said laser light having a wavelength of 248 nm, 353 nm, 308 nm or 193 nm.

14. A method of forming a transistor comprising:

forming a wiring comprising a portion as a gate electrode, said portion being formed on a semiconductor island;

first introducing an impurity into said semiconductor island with said portion as a mask;

forming an anodic oxide at least on a side surface of said wiring after said introducing step;

second introducing an impurity into said semiconductor island with said portion and said oxide as a mask;

removing a least a portion of said anodic oxide after said second introducing step; and irradiating a light to said semiconductor island after said removing step, wherein said light comprises a laser light having a wavelength of 248 nm, 353 nm, 308 nm or 193 nm.

15. A method of forming a transistor comprising:

irradiating a laser light to a semiconductor region;

forming a gate electrode comprising aluminum on said semiconductor region;

first introducing an impurity into said semiconductor region with said gate electrode as a mask;

forming an aluminum oxide at least on a side surface of said gate electrode by anodic oxidation after said introducing step;

second introducing an impurity into said semiconductor region with said gate electrode and said aluminum oxide as a mask;

removing said aluminum oxide after said second introducing step; and activating said impurity in said semiconductor region after said removing step;

wherein said irradiating step is carried out before said gate electrode forming step.

16. A method of forming a transistor comprising:

irradiating a laser light to a semiconductor island;

forming a wiring comprising a portion as a gate electrode, said portion being formed on said semiconductor island;

first introducing an impurity into said semiconductor island with said portion as a mask;

forming an oxide at least on a side surface of said wiring by anodic oxidation after said introducing step;

second introducing an impurity into said semiconductor island with said portion and said oxide as a mask;

removing a portion of said oxide formed on said semiconductor island after said second introducing step; and activating the impurities in said semiconductor island after said removing step, wherein said irradiating step is carried out before said wiring forming step, and wherein said wiring comprises aluminum, and said oxide comprises aluminum oxide.

17. A method of forming a transistor comprising:

first irradiating a laser light to a semiconductor island;

forming a wiring comprising a portion as a gate electrode, said portion being formed on said semiconductor island;

first introducing an impurity into said semiconductor island with said portion as a mask;

forming an oxide at least on a side surface of said wiring after said introducing step;

second introducing an impurity into said semiconductor island with said portion and said oxide as a mask;

removing at least a portion of said oxide after said second introducing step; and activating the impurities in said semiconductor island after said removing step, wherein said first irradiating step is carried out before said wiring forming step, and wherein said wiring comprises aluminum, and said oxide comprises aluminum oxide.

18. A method of forming a transistor comprising:

forming a gate electrode comprising aluminum on a semiconductor region;

first introducing an impurity into said semiconductor region with said gate electrode as a mask;

forming an aluminum oxide at least on a side surface of said gate electrode by anodic oxidation after said introducing step;

second introducing an impurity into said semiconductor region with said gate electrode and said aluminum oxide as a mask;

removing said aluminum oxide after said second introducing step; and irradiating a laser light to said semiconductor region after said removing step, said laser light having a wavelength of 248 nm, 353 nm, 308 nm or 193 nm.

19. A method of forming a transistor comprising:

forming a wiring comprising a portion as a gate electrode, said portion being formed on a semiconductor island;

first introducing an impurity into said semiconductor island with said portion as a mask;

forming an oxide at least on a side surface of said wiring by anodic oxidation after said introducing step;

second introducing an impurity into said semiconductor island with said portion and said oxide as a mask;

removing a portion of said oxide formed on said semiconductor island after said second introducing step; and irradiating a laser light to said semiconductor island after said removing step, said laser light having a wavelength of 248 nm, 353 nm, 308 nm or 193 nm, wherein said wiring comprises aluminum, and said oxide comprises aluminum oxide.

20. A method of forming a transistor comprising:

forming a wiring comprising a portion as a gate electrode, said portion being formed on a semiconductor island;

first introducing an impurity into said semiconductor island with said portion as a mask;

forming an anodic oxide at least on a side surface of said wiring after said introducing step;

second introducing an impurity into said semiconductor island with said portion and said anodic oxide as a mask;

removing at least a portion of said anodic oxide after said second introducing step; and irradiating a light to said semiconductor island after said removing step, wherein said light comprises a laser light having a wavelength of 248 nm, 353 nm, 308 nm or 193 nm, and wherein said wiring comprises aluminum, and said anodic oxide comprises aluminum oxide.

* * * * *

UNITED STATES PATENT AND TRADEMARK OFFICE
CERTIFICATE OF CORRECTION

PATENT NO.   : 5,770,486  
DATED        : June 23, 1998  
INVENTOR(S)  : Hongyong Zhang et al.

Page 1 of 1

It is certified that error appears in the above-identified patent and that said Letters Patent is hereby corrected as shown below:

<u>Title page,</u>  
Please insert the following: Item -- [73] Assignee: Semiconductor Energy Laboratory Co., Ltd., Kanagawa-ken, Japan --

Signed and Sealed this

Third Day of December, 2002

JAMES E. ROGAN  
*Director of the United States Patent and Trademark Office*